(12) United States Patent
Meilland et al.

(10) Patent No.: US 9,799,957 B2
(45) Date of Patent: Oct. 24, 2017

(54) METHOD TO PRODUCE A ROD TAG AND TAG PRODUCED BY THE METHOD

(71) Applicant: ASSA ABLOY AB, Stockholm (SE)

(72) Inventors: Andre Meilland, Romont (CH); Eric Suligoj, Epalinges (CH); Jean-Miguel Robadey, Bossonnens (CH); Joel Defferrard, Semsales (CH); Patrick Monnard, Attalens (CH); Marc Bielmann, La Tour-de-Treme (CH)

(73) Assignee: ASSA ABLOY AB, Stockholm (SE)

( * ) Notice: Subject to any disclaimer, the term of this patent is extended or adjusted under 35 U.S.C. 154(b) by 31 days.

(21) Appl. No.: 13/742,725

(22) Filed: Jan. 16, 2013

(65) Prior Publication Data
US 2013/0181877 A1    Jul. 18, 2013

(30) Foreign Application Priority Data
Jan. 16, 2012 (EP) .................................. 12151321

(51) Int. Cl.
| | |
|---|---|
| H01Q 7/08 | (2006.01) |
| H01Q 1/22 | (2006.01) |
| H01Q 1/40 | (2006.01) |
| H01Q 1/42 | (2006.01) |
| H01Q 7/06 | (2006.01) |
| H05K 13/00 | (2006.01) |

(52) U.S. Cl.
CPC ............. *H01Q 7/08* (2013.01); *H01Q 1/2225* (2013.01); *H01Q 1/40* (2013.01); *H01Q 1/42* (2013.01); *H01Q 7/06* (2013.01); *H05K 13/0023* (2013.01); *Y10T 29/49018* (2015.01)

(58) Field of Classification Search
CPC ....... H01Q 7/08; H05K 13/00; H05K 13/0023
USPC ............................................. 343/788; 29/600
See application file for complete search history.

(56) References Cited

U.S. PATENT DOCUMENTS

| | | | |
|---|---|---|---|
| 5,393,001 A | 2/1995 | Gustafson | |
| 5,572,410 A | 11/1996 | Gustafson | |
| 7,825,869 B2 | 11/2010 | Masin et al. | |
| 2007/0075835 A1* | 4/2007 | Robadey | ................ B29C 41/14 340/10.1 |

(Continued)

FOREIGN PATENT DOCUMENTS

| | | |
|---|---|---|
| EP | 1770603 | 4/2007 |
| WO | WO 92/15105 | 9/1992 |

OTHER PUBLICATIONS

European Search Report for European Patent Application No. 12151321.2 dated Jun. 22, 2012, 1 page.

*Primary Examiner* — Dieu H Duong
(74) *Attorney, Agent, or Firm* — Sheridan Ross P.C.

(57) ABSTRACT

A method to produce a rod tag and tag produced according to the method, wherein the method comprises at least the steps of:
providing a magnetic core having a cylindrical shape and two end,
winding a wire around said core to form an antenna,
positioning in longitudinal extension a chip at one of the ends of said rod where the wound wire ends terminates,
bonding said wire ends to contacts of said chip,
displacing said bonded chip at least partially on said end of said rod, and
introducing said core with said wire and said chip in an encapsulating means containing a stabilizing material, whereby the chip is further positioned on said end by the friction between said chip and said material during introduction.

20 Claims, 3 Drawing Sheets

(56) References Cited

U.S. PATENT DOCUMENTS

2011/0259965 A1* 10/2011 Mejia ............... G06K 19/07773
  235/492

* cited by examiner

METHOD TO PRODUCE A ROD TAG AND TAG PRODUCED BY THE METHOD

CROSS REFERENCE TO RELATED APPLICATIONS

This application claims the benefit of European Patent Application No. 12151321.2 filed Jan. 16, 2012, the disclosure of which is incorporated herein by reference.

TECHNICAL FIELD

The present invention concerns the field of rod tags comprising a ferrite rod core with a wound antenna around said rod core and more specifically the method used to produce such a tag.

BACKGROUND ART

Rod tags are well known RFID devices which usually comprise a ferrite rod around which a wire is wound to form an antenna and the antenna is connected then to a chip, thus forming the tag. Typically, such tags are encapsulated in a glass or synthetic casing to form the finished product.

The technology of fabricating such rod tags is well known in the art. Prior art documents disclose in particular the step to bond the extremity of the winded wire (antenna) directly on the pads of a RFID chip: this is also called direct bonding.

Prior art documents include for example the following publications, all incorporated by reference in the present application.

U.S. Pat. No. 5,393,001 discloses a coil winding equipment for winding an antenna on a core, for example a ferrite core that is used in a rod tag.

U.S. Pat. No. 5,572,410 discloses an integrated circuit device having a winding connected to an integrated circuit solely by a wire. More specifically, this patent discloses a rod tag with a core, such as a ferrite core, on which a winding is produced forming an antenna, two ends of the antenna being soldered to contacts of an electronic circuit. In this classical configuration, the electronic circuit is placed at the end of the rod which is cylindrically shaped.

U.S. Pat. No. 7,825,869 discloses miniature transponders in the shape of rod tags. The disclosed tags comprise a capsule enclosure housing which contains a magnetic antenna core, such as a ferrite core, with a shaped form to provide space for an integrated circuit also included in the capsule enclosure housing. More specifically, in this prior art, embodiments are described that effectively utilize substantially all the available space within a given enclosure or capsule to accommodate the largest possible antenna assembly including a ferrite core and antenna coil/coils windings while still allowing a reliable functional attachment of an integrated circuit to the wire leads of the antenna ferrite core within the same enclosure. The wired leads may be direct bonded to the integrated circuit. As described in this prior art reference, an antenna ferrite core (or magnetic core), which extends substantially through the full length of the available space within a capsule enclosure, is shaped in such a way as to allow the miniature, direct-bonded integrated circuit to be located within the space provided by the pre-shaped end of the ferrite core. This use of the pre-shaped space allows for placement of the IC without increasing the overall length of the assembly beyond the length of the ferrite core and without requiring an increase in the size of the capsule. After placement of the direct-bonded integrated circuit (IC), the IC can be left loose within the capsule enclosure, or it can be glued to the side of the ferrite core after the direct-bonding process has been accomplished, as desired. Protection against shock and damage by vibration within the encapsulation can be accomplished by insertion of stabilizing epoxy or other material within the capsule. This stabilizing epoxy surrounds the ferrite core and the IC to hold them in place. In one embodiment of U.S. Pat. No. 7,825,869 the integrated circuit is not positioned in a preshaped space of the core but is positioned adjacent a side of the core over the windings. For this embodiment, assuming the core remains relatively the same size, the capsule containing the tag would have to be larger than the capsule used for the other depicted embodiments where the IC is placed in a in space of the core in order to make room for the integrated circuit. Still, the main teaching of this prior art is to provide a predetermined space in the rod to place the IC in said space.

A drawback of the classical rod tag configurations as disclosed in the above prior art is that the chip is positioned at the extremity of the rod, adding its own length to the total tag length. In order to obtain the maximal tag reading range, it is desired to maximize the length of the magnetic core on which the antenna wire is winded. Ideally, it should match the available length in its encapsulation (i.e. glass tube).

A solution is given in U.S. Pat. No. 7,825,869 but here the rod has to be modified which has a consequence on its symmetry and renders its handling more difficult. In particular, its position and that of its space have to be known to ensure a proper assembly of the disclosed device.

Another solution is given in US 2011/0259965. In this publication, the antenna core, for example a ferrite core, comprises an elongated structure with a central section and end sections. The central section is used to install the antenna coil and the end sections have top and bottom planar surfaces for mounting an integrated circuit. Accordingly, the core is not symmetrical either (as in U.S. Pat. No. 7,825,869) and its position has to be precisely defined during the manufacturing process in order to be able to mount the circuit at the right place. The method disclosed includes the steps of attaching the antenna to the core, attaching the circuit to whichever of said surfaces that is proximate to the leads of the installed antenna and connecting the leads to the circuit.

As mentioned previously, this known device has the disadvantage of a non-symmetrical ferrite core which implies in addition that a manufacturing step is necessary to shape the core and has the consequence of a loss of material. This device and the necessary production process is therefore time consuming and more expensive.

SUMMARY OF THE INVENTION

It is therefore an aim to improve the known methods and devices to produce a rod tag as described hereabove.

It is a further aim of the present invention to propose a method and a rod tag which are more efficient than the previously known methods and devices, providing longer read range or allowing miniaturization (of the tag size) without decreasing performances.

Another objective of the method of the invention is to use a pure symmetrical (according its main cylindrical axe) magnetic core, meaning that there is no need to orientate correctly the core previous to its use i.e. simplifying greatly the process in regards of the solutions of the art cited above.

The present invention and its different embodiments are defined by the appended claims.

In an embodiment, the invention concerns a method of producing a rod RFID tag, wherein the method comprises at least the following steps:
- providing a magnetic core having a cylindrical shape and two end,
- winding a wire around said core to form an antenna,
- positioning in longitudinal extension a chip at one of the ends of said rod where the wound wire ends terminates,
- bonding said wire ends to contacts of said chip,
- displacing said bonded chip at least partially on said end of said rod,
- introducing said core with said wire and said chip in an encapsulating means containing a stabilizing material, whereby the chip is further positioned on said end by the friction between said chip and said material during introduction.

In an embodiment, the shape of the magnetic core is symmetrical in regards to its main axe.

In an embodiment, the bonding of the wire ends to the chip contacts is made by direct bonding.

In an embodiment, the displacing of the bonded chip on the end of the rod is made by a radial and longitudinal movement.

In an embodiment, the method comprises in addition the step of closing the encapsulating means.

In an embodiment, the invention concerns a tag produced by the method as described herein.

In an embodiment, the tag comprises a magnetic core which is a ferrite core.

In an embodiment the tag comprises encapsulation means. The encapsulation means may be a glass tube.

In an embodiment, the tag comprises stabilizing material. This stabilizing material may be a resin.

BRIEF DESCRIPTION OF THE DRAWINGS

The invention will be better understood by a detailed description of different exemplary embodiments and from the drawings which show.

DETAILED DESCRIPTION

Figure 1:
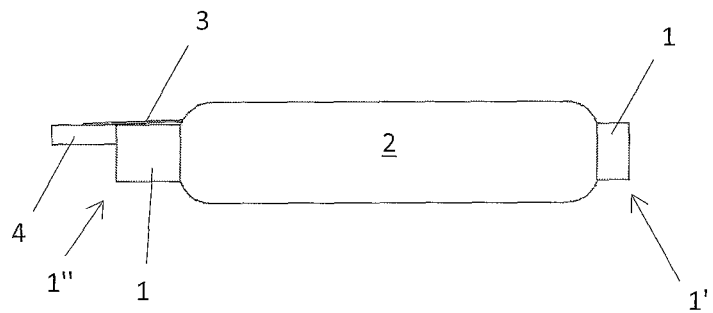
FIG. 1 illustrates a side view of a tag produced according to present invention in a first state.

An idea of the present invention is to take advantage of the small size of the chip to place it in a free space without specifically shaping the rod forming the magnetic core. Accordingly, the core has a simple and pure cylindrical shape not necessitating some additional shaping steps as in the prior art. This saves time and material (and is therefore cheaper). In addition, this also avoids positioning constraints linked to the shape of the magnetic core as in the prior art. There is no need any more to hold it in a certain known position to ensure that the chip is placed in the space provided in the core as in U.S. Pat. No. 7,825,869 and US 2011/0259965 for example.

Further, the present invention takes advantage of the presence of stabilizing material (for example epoxy or any other suitable material) in the encapsulating means (for example a glass tube) to displace, for example push, the chip in its proper final position when introducing the tag in the encapsulating means which is a particularly advantageous production step as will be understood in the following description and with reference to the drawings.

In the method of producing a rod RFID tag according to the invention (see FIG. 1), the method comprises firstly the step of providing a magnetic core 1 having a cylindrical shape and two end 1', 1". Then, the next step is typically the winding a wire around the core 1 to form an antenna 2. Once the winding is finished, there remain two ends 3 of the wire used to produce the antenna that will be connected to the chip, as explained later hereunder.

In the next step, one positions a chip 4 at one of the ends 1', 1" of the rod 1 in longitudinal extension of the rod, as is known in the art. Of course, this is done at the end of the rod where the wound wire ends 3 terminate. The wire ends 3 are then bonded to the chip 4 contacts in order to form a basic RFID rod tag.

The bonding process used can be of any type, as is known in the art, for example direct bonding or from the prior art cited above.

The position of the chip 4 illustrated on the FIG. 1 corresponds to a standard product configuration as produced in the state of the art.

Figure 2:
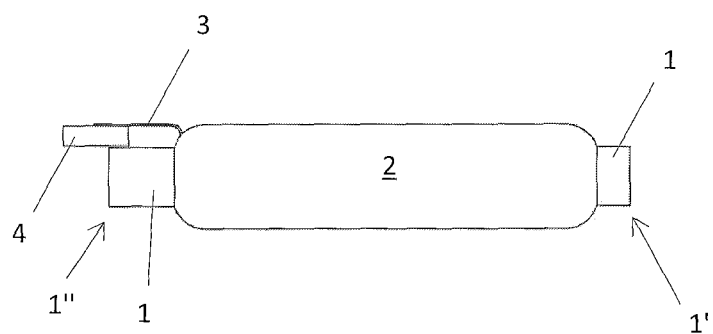
FIG. 2 illustrates a side view of a tag produced according to present invention in a second state.

In regards to the present invention, once the chip is bonded, it is then displaced from its position in longitudinal extension of the rod illustrated in FIG. 1 in a second position partially over one end 1' or 1" of the rod 1 as illustrated in FIG. 2. This configuration is an intermediate one as the basic RFID rod tag must still to be put into an encapsulation as will be described now.

Figure 3:
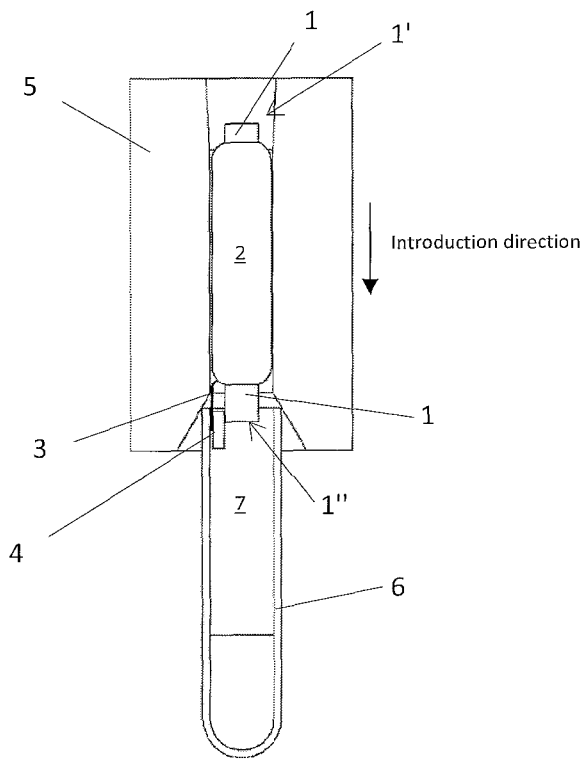
FIG. 3 illustrates a side view of a tag being introduced in an encapsulating means according to present invention.

To carry out this step, one uses a sliding tool 5 (see FIG. 3) in which the rod tag is introduced, said tool allowing an alignment of the rod with an encapsulation means 6, for example a glass tube 6. As illustrated in FIG. 3, the rod tag is in the state of FIG. 2, with the chip 4 partially placed on one end 1" of the rod 1. Advantageously, small vibrations could be applied to the tool 5 in order to facilitate the sliding down of the rod tag.

Since the encapsulating means 6 contains a stabilizing material 7, for example en epoxy resin, the chip 4 is pushed backwards with respect to the introduction direction (see arrow in FIG. 3) and further positioned over said end 1" by the friction between the chip 4 and the stabilizing material during introduction, thus placing the chip in its final position on the rod 1.

Figure 4:
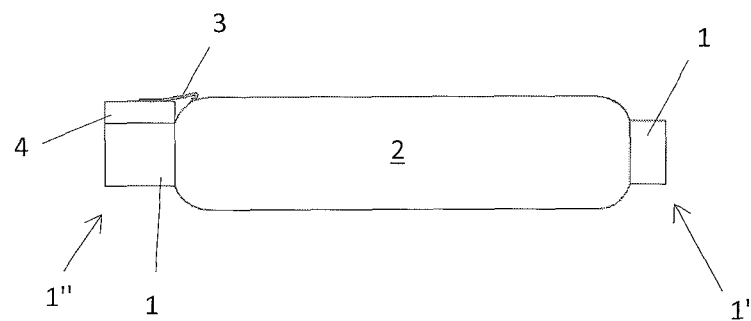
FIG. 4 illustrates a side view of a tag produced according to present invention in a final state.
Figure 5:
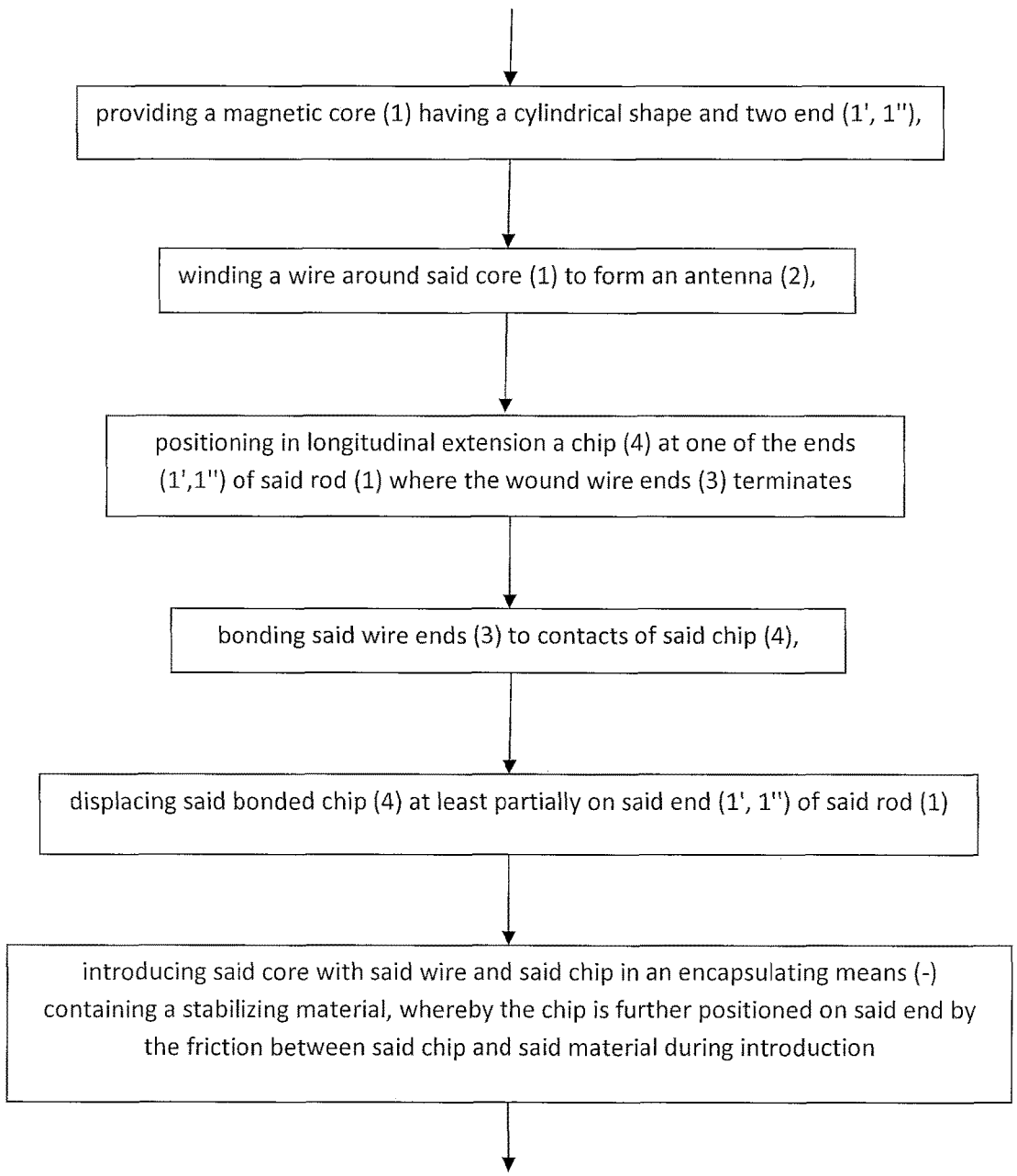
FIG. 5 illustrates a block-diagram of the process according to the invention.

This ideal final position of the chip 4 relative to the rod 1 is illustrated in FIG. 4. The chip 4 is fully pushed toward the coil windings 2 and fit perfectly the space over the rod end 1". In this case naturally, the antenna 2 has be manufactured such that the length of the free end 1" of the rod match the size of the chip 4.

Another advantage of moving the chip 4 toward the coil winding is to create a loose loop with the wire ends that reduce the mechanical tensions/stresses to the connections to the chip. This increases drastically the durability of the product.

Finally, the encapsulation means, for example a glass tag is closed to form the final RFID tag.

Accordingly, the method of the present invention is very simple since it may be used with current devices, does not imply the fabrication of a specific rod and uses present materials (typically the stabilizing material) to form the final product in an efficient way.

As indicated previously, any bonding technique may be used, the bonding of the wire ends to the chip contacts is made by direct bonding or any other equivalent technique.

The stabilizing material may be of any type as known in the prior art: a resin such as epoxy resin or any other suitable equivalent material.

Preferably, to optimize the characteristics of the tag, the rod has a shape (in particular the ends of the rod) that conforms to the shape of the encapsulation in order to able to insert the biggest (i.e. longest) rod possible in the encapsulation. The positioning of the chip 4 on the rod 1 allows this optimization of the size of the rod to the encapsulation, the rod being generally in its simplest form (cylindrical).

Of course, all the embodiments described herein are to be regarded as illustrative examples and not in a limiting manner. Modifications are possible within the scope of the present invention, for example by use of equivalent means.

The invention claimed is:

1. A method of producing a rod RFID tag, comprising:
   providing a rod having a magnetic core, a cylindrical shape, and two distal ends;
   winding a wire around said magnetic core to form an antenna;
   positioning at one of said two distal ends of said rod where said wound wire ends terminate, an entire chip at a first position in longitudinal extension beyond the end of said rod;
   bonding said wire ends to contacts of said chip;
   displacing said bonded chip to a second position parallel with end of said rod and partially extending over one of said distal ends of said rod; and
   introducing said magnetic core with said wire and said chip in an encapsulating means containing a stabilizing material, whereby said chip is further displaced to a third position on said end of said rod closer to said wire winding by the friction between said chip and said stabilizing material during introduction and held in said third position by said stabilizing material.

2. The method as defined in claim 1, wherein said cylindrical shape of said rod is symmetrical in regards to its main axis.

3. The method as defined in claim 1, wherein said bonding of said wire ends to said chip contacts is made by direct bonding.

4. The method as defined in claim 1, wherein said displacing of said bonded chip on said end of said rod is made by a radial and longitudinal movement.

5. The method as defined in claim 1, wherein the method further comprises:
   closing said encapsulating means.

6. A tag produced by the method of claim 1.

7. The tag as defined in claim 6, wherein said magnetic core is a ferrite core.

8. The tag as defined in claim 6, wherein said encapsulation means is a glass tube.

9. The tag as defined in claim 6, wherein said stabilizing material is a resin.

10. The tag as defined in claim 6, wherein said stabilizing material is an epoxy.

11. The method as defined in claim 1, wherein the step of introducing said magnetic core with said wire and said chip in an encapsulating means comprises aligning said core, wire and chip with said encapsulating means.

12. The method as defined in claim 11, further comprising using a sliding tool for aligning said core, wire and chip with said encapsulating means.

13. The method of claim 12 further comprising vibrating said sliding tool.

14. A method of producing a rod RFID tag, comprising:
   providing a rod having a magnetic core, a cylindrical shape, and two distal ends;
   winding a wire around said magnetic core to form an antenna;
   positioning, at a first position in full longitudinal extension, an entire chip at one of said two distal ends of said rod where said wound wire ends terminate;
   bonding said wire ends to contacts of said chip;
   displacing said bonded chip to a second position partially extending over one of said distal ends of said rod; and
   introducing said magnetic core with said wire and said chip in an encapsulating means containing a stabilizing material, whereby said bonded chip is further longitudinally moved along said end of said rod by the friction between said chip and said stabilizing material during introduction to a third position and held in said third position by said stabilizing material, wherein said bonded chip is in frictional communication with said rod and said stabilizing material.

15. A method of producing a rod RFID tag, comprising:
   providing a rod having a magnetic core, a cylindrical shape, and two distal ends;
   winding a wire around said magnetic core to form an antenna;
   positioning a chip at a first position, said first position defined at one of said two distal ends of said rod where said wound wire ends terminate, and wherein said entire chip is beyond the end of said rod;
   bonding said wire ends to contacts of said chip;
   displacing said bonded chip to a second position parallel with the end of said rod and partially extending over one of said distal ends of said rod; and
   introducing said magnetic core with said wire and said chip in a glass tube containing a stabilizing material, whereby said chip is further displaced to a third position to form a loop in the ends of said wire.

16. The method as defined in claim 15, wherein said cylindrical shape of said rod is symmetrical in regards to its main axis.

17. The method as defined in claim 15, wherein said bonding of said wire ends to said chip contacts is made by direct bonding.

18. The method as defined in claim 15, wherein said displacing of said bonded chip on said end of said rod is made by a radial and longitudinal movement.

19. The method as defined in claim 15, wherein the method further comprises closing said glass tube.

20. The method as defined in claim 15, wherein the step of introducing said magnetic core with said wire and said chip in a glass tube comprises using a vibrating tool.

\* \* \* \* \*